Figure 1:
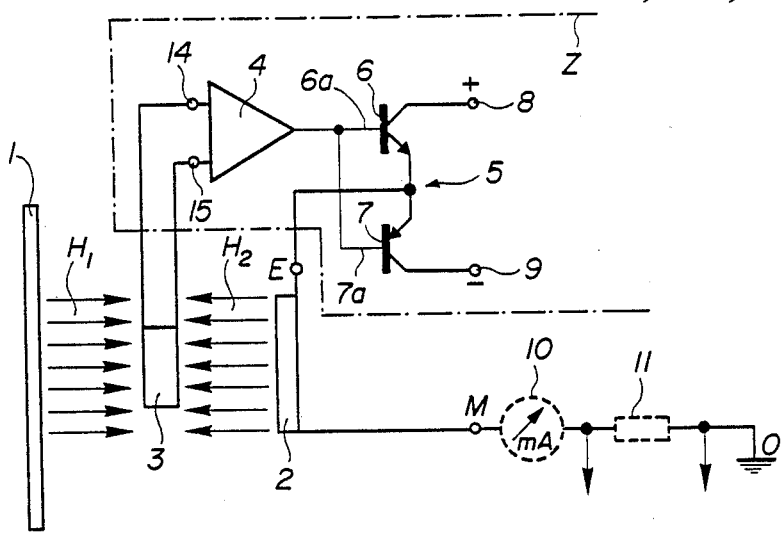

United States Patent [19]

Cattaneo et al.

[11] Patent Number: 4,939,449

[45] Date of Patent: Jul. 3, 1990

[54] ELECTRIC CURRENT SENSING DEVICE OF THE MAGNETIC FIELD COMPENSATION TYPE

[75] Inventors: Pierre Cattaneo, Collonges-sous-Salève, France; René Chuat, Plan-Les-Ouates, Switzerland

[73] Assignee: Liaisons Electroniques-Mecaniques Lem SA, Plan-Les-Ouates, Switzerland

[21] Appl. No.: 373,667

[22] Filed: Jun. 29, 1989

Related U.S. Application Data

[63] Continuation of Ser. No. 131,226, Dec. 10, 1987, abandoned.

[30] Foreign Application Priority Data

Dec. 12, 1986 [CH] Switzerland .................. 4957/86

[51] Int. Cl.⁵ .................. G01R 33/00; H01F 40/06
[52] U.S. Cl. .................. 324/117 R; 324/117 H; 324/244; 324/127; 324/252; 336/200; 307/309
[58] Field of Search .................. 324/117 R, 117 H, 251, 324/252, 127; 338/32 H; 307/309, 494, 495, 270, 296, 297; 336/200, 205

[56] References Cited

U.S. PATENT DOCUMENTS

| | | | |
|---|---|---|---|
| 3,573,616 | 4/1971 | Kahen | 324/251 X |
| 3,816,766 | 6/1974 | Anselmo et al. | 307/309 X |
| 4,096,547 | 6/1978 | Calabro | 361/388 X |
| 4,469,961 | 9/1984 | Milberger et al. | 307/495 X |
| 4,488,112 | 12/1984 | Thompson et al. | 324/251 X |
| 4,522,671 | 6/1985 | Grunwald et al. | 336/200 |
| 4,536,710 | 8/1985 | Dunham | 324/253 X |
| 4,574,330 | 3/1986 | Cohen et al. | 361/388 X |
| 4,639,665 | 1/1987 | Gary | 324/117 H |
| 4,706,017 | 11/1987 | Wilson | 336/200 |
| 4,749,939 | 6/1988 | Seitz | 324/251 X |
| 4,756,081 | 7/1988 | Penn | 361/388 X |

FOREIGN PATENT DOCUMENTS 0154264 9/1983 Japan .................. 338/32 H

OTHER PUBLICATIONS

Faizuliev, B. N., et al., "Reference Book on Printed Circuits", Soviet Radio magazine, published in Moscow, USSR, 1972.

Primary Examiner—Reinhard J. Eisenzopf
Assistant Examiner—Vinh P. Nguyen
Attorney, Agent, or Firm—Cushman, Darby & Cushman

[57] ABSTRACT

An electric current sensing device for measuring a primary current of relatively high intensity. The device includes a magnetic circuit that is coupled with a primary conductor and with a measuring coil that is connected to a current source through an associated control circuit. The magnetic circuit includes an air gap which accommodates a magnetic field detector that is electrically connected to an input of the control circuit for controlling a magnetic field compensating current that is supplied to the measuring coil. The device also includes a printed circuit that is arranged to both minimize electromagnetic interference between the measuring current circuit and the control circuit input, and improves heat dissipation of the printed circuit, thus optimizing the size ratio of the maximum primary current to the bulk of the device and improving performance of the same.

2 Claims, 2 Drawing Sheets

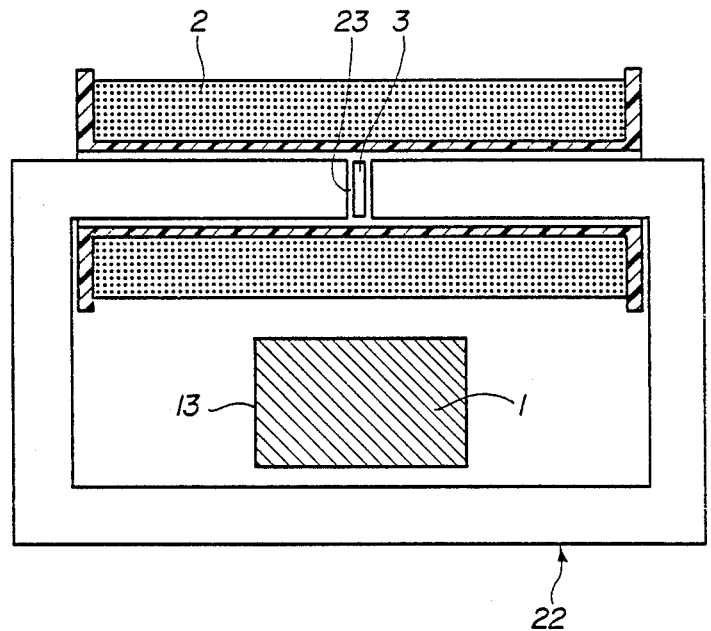
FIG. IA

ELECTRIC CURRENT SENSING DEVICE OF THE MAGNETIC FIELD COMPENSATION TYPE

This is a continuation of application No. 07/131,226, filed Dec. 10, 1987, which was abandoned upon the filing hereof.

The present invention relates to an electric current sensing device to be used for measuring a relatively high current flowing in a conductor and/or producing an image thereof. More particularly, the invention relates to a current sensing device comprising at least one magnetic circuit arranged so as to be capable of being coupled with a primary conductor in which flows the current to be sensed, the magnetic circuit having at least one air gap and at least one measuring coil being coupled with said circuit. Magnetic field detector means are arranged in said air gap. A current source and an associated control circuit have input terminals coupled with said magnetic field detector means, current measuring and/or displaying means are connected in series with that measuring coil and said control circuit has output terminals connected to said series connection.

It is an object of the present invention to provide a sensing device of the above described type which can be realized in a reduced size so as to increase the ratio of the maximum primary current acceptable and the volume as well as the manufacturing cost of the device. A further object of the invention is to increase the precision of the measuring device by reducing electromagnetic interferences between various parts of the arrangement.

In accordance with the invention, the measuring coil, the magnetic field detector means, the current measuring and/or displaying means and the current source mentionned above are connected by printed circuit arranged on a printed circuit board in such a way that a first control circuit output terminal, which is connected to the measuring coil, as well as the printed circuit portions which are directly connected with and thus are at the same potential as said first output terminal, are located in a zone of said circuit board which is substantially distant from the zone in which said control circuit input terminals are located.

Furthermore, in accordance with the invention, the measuring coil, the magnetic field detector means, the current measuring and/or displaying means and the current source mentioned above are connected to a printed circuit arranged on a printed circuit board comprising an opening for receiving said primary conductor, said opening being provided on at least one side of the board and on the major part, but not on the totality of its perimeter, with conductive portions at a constant potential. A further feature of the invention consists in arranging said printed circuit so that it comprises metallized zones which are oversized, in the plane of the board, with respect to the needs of electrical conduction so as to improve heat dissipation.

Figure 2:
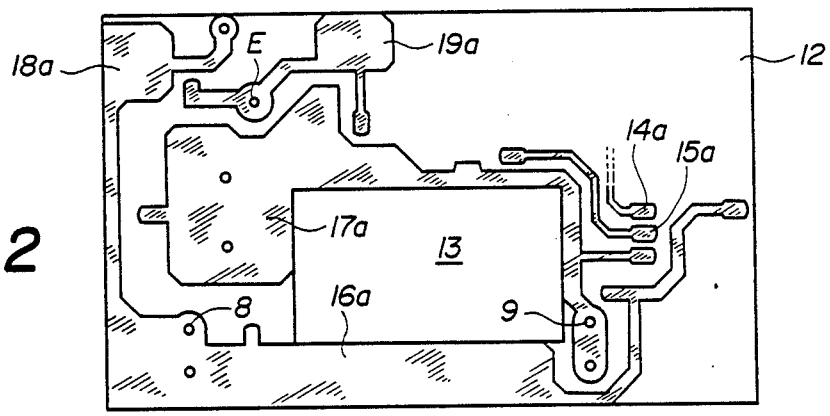
Figure 3:
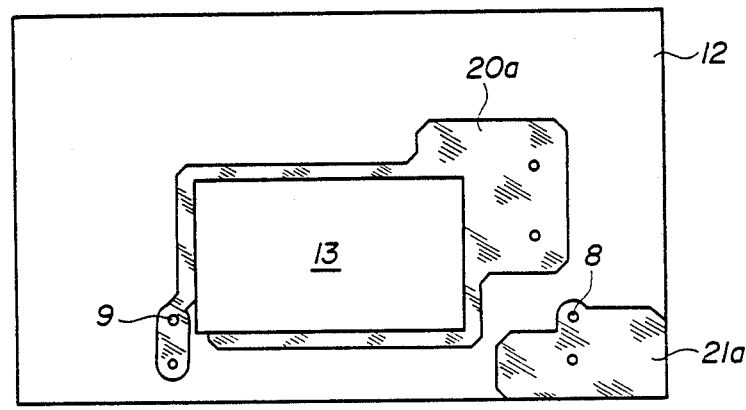

Further features and advantages of the device according to the present invention will appear more clearly from the following description, given by way of example, of a preferred embodiment illustrated in the attached drawings in which FIG. 1 is a schematic diagram of the basic electric circuit of a sensing device as concerned by the invention, FIG. 1A is a view, partially in section, of the magnetic circuit of a sensing device according to FIG. 1, FIG. 2 is a view of one of the faces of a printed circuit board of a device according to the invention on which only parts of the metallization have been represented, and FIG. 3 is a view of the opposite face of the printed circuit board of FIG. 2 on which also certain parts only of the whole metallization have been represented.

According to the diagram of FIG. 1, a primary conductor 1 is coupled with a magnetic circuit (not shown in FIG. 1), in which it produces a magnetic field $H_1$. This magnetic circuit which is shown in FIG. 1A is formed by an assembly 22 of superposed C-shaped sheets of magnetically permeable material, and is arranged to allow the passage of the primary conductor 1 substantially in the center of it. The primary conductor can, of course, also form a winding coupled with the magnetic circuit and the latter may have a shape different from the one shown. Primary conductor is electromagnetically coupled, on the other hand, with a measuring coil 2, which in operation is supplied with a measuring current producing a magnetic field $H_2$ in the opposite direction of field $H_1$. The magnetic circuit has an air gap 23 which accomodates a magnetic field detector 3 preferably formed by a Hall effect device, the output signal of which is applied to terminals 14, 15 of a control circuit Z. The latter comprises in particular an amplifier 4 and a measuring current supply circuit 5 represented by a pair of transistors 6, 7 connected in series between the positive terminal 8 and the negative terminal 9 of a current source (not shown). The output of amplifier 4 is connected to control electrodes 6a, 7a of transistors 6, 7 respectively the emittors of which are connected together to a first node "E" of the measuring coil 2. A second node "M" of that coil is connected through a current measuring device 10 and/or a measuring resistor 11 of low resistance, to ground by terminal O.

When a primary current is flowing in conductor 1, the Hall effect detector 3 detects the difference between fields $H_1$ and $H_2$ and provides a control signal which is used to control the measuring current in coil 2 so as to bring said difference substantially to zero. The current measured between terminals M and O therefor represents at any moment the value of the primary current, thus providing an image thereof.

It should be noted that the term "measuring" as used herein represents the derivation from the sensed current a magnitude describing the intensity of said current, in particular the instant intensity as a function of time, while image-producing is meant to represent all conventional means of displaying or otherwise producing a representation of electrical current variations in time.

The present invention can comprise a printed circuit board 12 that is represented as seen from either face in FIGS. 2 and 3, respectively. Printed circuit board 12 comprises a central aperture 13 which accommodates the primary conductor 1. The metallizations formed on each of the two faces of the printed circuit board are only partially represented in FIGS. 2 and 3. The components mounted on the board and other circuit parts which are connected to metallizations 14a–21a namely the measuring coil 2, the electric current source connected to terminals 8 and 9, and the current measuring and/or displaying devices connected to node M are not shown in FIGS. 2 and 3.

A face of the printed circuit board represented in FIG. 2 shows in particular the position of node E of the measuring coil 2 and the position of the input terminals 14, 15 of amplifier 4 connected to metallizations 14a, 15a respectively. Metallization 19a represents first conductive portions of a printed circuit formed on the printed circuit board 12 and is directly connected to the node E; metallizations 14a and 15a, respectively connected directly to input control terminals 14 and 15 of the amplifier 4 shown in FIG. 1, collectively represent second conductive portions of that printed circuit. It can be appreciated that the illustrated arrangement of these terminal metallizations, according to which node E and the connection portions which are at the same potential, are substantially spatially separated from the input terminals of amplifier 4, which allows significant reduction of electromagnetic disturbances of the control circuit, in particular regarding high frequency components.

A further arrangement of the present invention which leads to a substantial improvement of the performance of the present device and which allows to realize the same in a very compact form, is also shown in FIGS. 2 and 3. This arrangement consists of metallized portions surrounding the major part of aperture 13 on at least one face, and preferably on both faces of the printed circuit board 12. These portions comprise substantially the portions 17a, 20a connected to terminal 9 of the current source and which are thus maintained at a constant electric potential. Those portions which do not form an entirely closed loop around the opening 13, provide effective screening with respect to electro-magnetic radiation from the primary conductor 1. This avoids in particular electromagnetic disturbances due to current in the primary conductor 1, more specifically, when great variations of the primary current intensity occur.

Yet another feature of the printed circuit board of the present invention is shown in FIGS. 2 and 3 in relation to the metallized connecting portions of the printed circuit. These metallizations comprise larger zones which are substantially oversized, in the plane of the board, with respect to the requirements of electrical conduction between the various points to be connected, the shown arrangement allowing to provide thermal isolation leading to improved heat dissipation from the board 12. Such extended connecting portions are in particular the zones 16a to 21a, represented in FIGS. 2 and 3. This feature further contributes to the improvement of the operation of the present device and allows to reduce the size of the same to a minimum which is essentially defined by the outer dimensional requirements of the magnetic circuit.

We claim:

1. An electric current sensing device for measuring an electric current flowing in a primary conductor and/or for producing an image thereof, comprising:
   magnetic circuit means capable of being magnetically coupled with said primary conductor, said magnetic circuit means comprising at least one air gap and at least one measuring coil magnetically coupled with said magnetic circuit means, said measuring coil comprising first and second ends, said first and second ends comprising first and second nodes;
   magnetic field detector means disposed in said air gap;
   electric current control means including a current source and a current control circuit,
   said current control circuit having first and second current supply terminals,
   said current control circuit further having a control input and a measuring current supply output, said control input being connected to said magnetic field detector means and said measuring current supply output being connected to said first node of said measuring coil; and
   electric current output means, comprising at least one of measuring means and display means, connected to said second node of said measuring coil;
   a printed circuit board;
   said electric current control circuit comprising a printed circuit formed on said printed circuit board;
   said measuring coil, said magnetic field detector means, said current output means, and said current source being connected to said printed circuit;
   said printed circuit having first conductive portions directly connected to said first node, and second conductive portions directly connected to said control input;
   said first and second portions being arranged at a substantial distance from each other;
   said printed circuit board having an aperture for receiving said primary conductor, said aperture being surrounded on at least one face of said printed circuit board, along the major part of the perimeter of said aperture, by conductive portions at a constant potential.

2. The electric current sensing device of claim 1, wherein said printed circuit board comprises heat dissipation means formed by portions of said printed circuit of said electric current control circuit.

* * * * *